US007985075B2

(12) United States Patent
Chang

(10) Patent No.: US 7,985,075 B2
(45) Date of Patent: Jul. 26, 2011

(54) MICRO ELECTROMECHANICAL SYSTEM CONNECTOR AND METHOD FOR MANUFACTURING SAME

(75) Inventor: Jen-Tsorng Chang, Tu-Cheng (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 12/730,249

(22) Filed: Mar. 24, 2010

(65) Prior Publication Data

US 2011/0045678 A1 Feb. 24, 2011

(30) Foreign Application Priority Data

Aug. 21, 2009 (CN) .......................... 2009 1 0305886

(51) Int. Cl.
*H01R 12/00* (2006.01)
(52) U.S. Cl. ......................................................... 439/59
(58) Field of Classification Search .................. 439/59, 439/79–80, 541.5, 631, 377, 637
See application file for complete search history.

(56) References Cited

U.S. PATENT DOCUMENTS

| 6,132,224 | A  | * | 10/2000 | Murakami et al. | ............. | 439/77 |
| 6,736,647 | B1 | * | 5/2004 | Gillenberg | ...................... | 439/65 |
| 6,746,257 | B2 | * | 6/2004 | Billman | ........................ | 439/160 |
| 6,781,230 | B2 | * | 8/2004 | Tsukamoto | .................... | 257/700 |
| 7,416,452 | B1 | * | 8/2008 | Sabo | ............................. | 439/631 |
| 7,442,055 | B2 | * | 10/2008 | Robinette | ........................ | 439/79 |
| 7,857,628 | B2 | * | 12/2010 | Chung et al. | ..................... | 439/59 |
| 2010/0055931 | A1 | * | 3/2010 | Chung et al. | ..................... | 439/59 |

* cited by examiner

*Primary Examiner* — Jean F Duverne
(74) *Attorney, Agent, or Firm* — Raymond J. Chew

(57) ABSTRACT

A micro electromechanical system connecter includes a u-shaped plug connecter and a socket connector. The plug connecter includes two opposite substrates and a spacing element sandwiched therebetween and positioned at one ends of the two substrates. Two parallel grooves are defined in outer surfaces of the two substrates at the other ends the two substrates. A plurality of parallel first electrodes formed on the outer surfaces of the two substrates and configured to extend along a direction perpendicular to grooves. The socked connecter includes a base having a top surface. A recess is defined in the top surface. Two protrusions are respectively formed on two internal walls of the recess adjacent to the entrance of the recess. A plurality of parallel second electrodes formed on the base according to the first electrodes. Each second electrode extends from the top surface of the base to one of the two internal walls of the recess.

18 Claims, 19 Drawing Sheets

MICRO ELECTROMECHANICAL SYSTEM CONNECTOR AND METHOD FOR MANUFACTURING SAME

BACKGROUND

1. Technical Field

The present disclosure relates micro electromechanical system (MEMS) connectors and a method for manufacturing the MEMS connectors.

2. Description of Related Art

As electrical devices such as personal digital assistants (PDAs) and notebook computers become smaller, the need for ever smaller connectors grows. However, in a typical method of manufacturing connectors, such as a module punching, it is difficult to manufacture small connectors having electrode gaps less than 0.3 millimeters.

Therefore, a new connector and a method for manufacturing the same are desired to overcome the above-described shortcoming.

BRIEF DESCRIPTION OF THE DRAWINGS

The components in the drawings are not necessarily drawn to scale, the emphasis instead being placed upon clearly illustrating the principles of at least one embodiment. In the drawings, like reference numerals designate corresponding parts throughout the various views.

DETAILED DESCRIPTION

Reference will now be made to the drawings to describe various inventive embodiments of the present disclosure in detail, wherein like numerals refer to like elements throughout.

Referring FIGS. 1 to 5, a micro electromechanical system (MEMS) connecter assembly 100 according to one embodiment of the present disclosure is shown. The MEMS connecter assembly 100 includes a MEMS plug connecter 200 and a MEMS socket connecter 300. The MEMS plug connecter 200 and the socket connecter 300 can be mounted on an external circuit board by wire bonding method or surface mounting technology.

Figure 1:
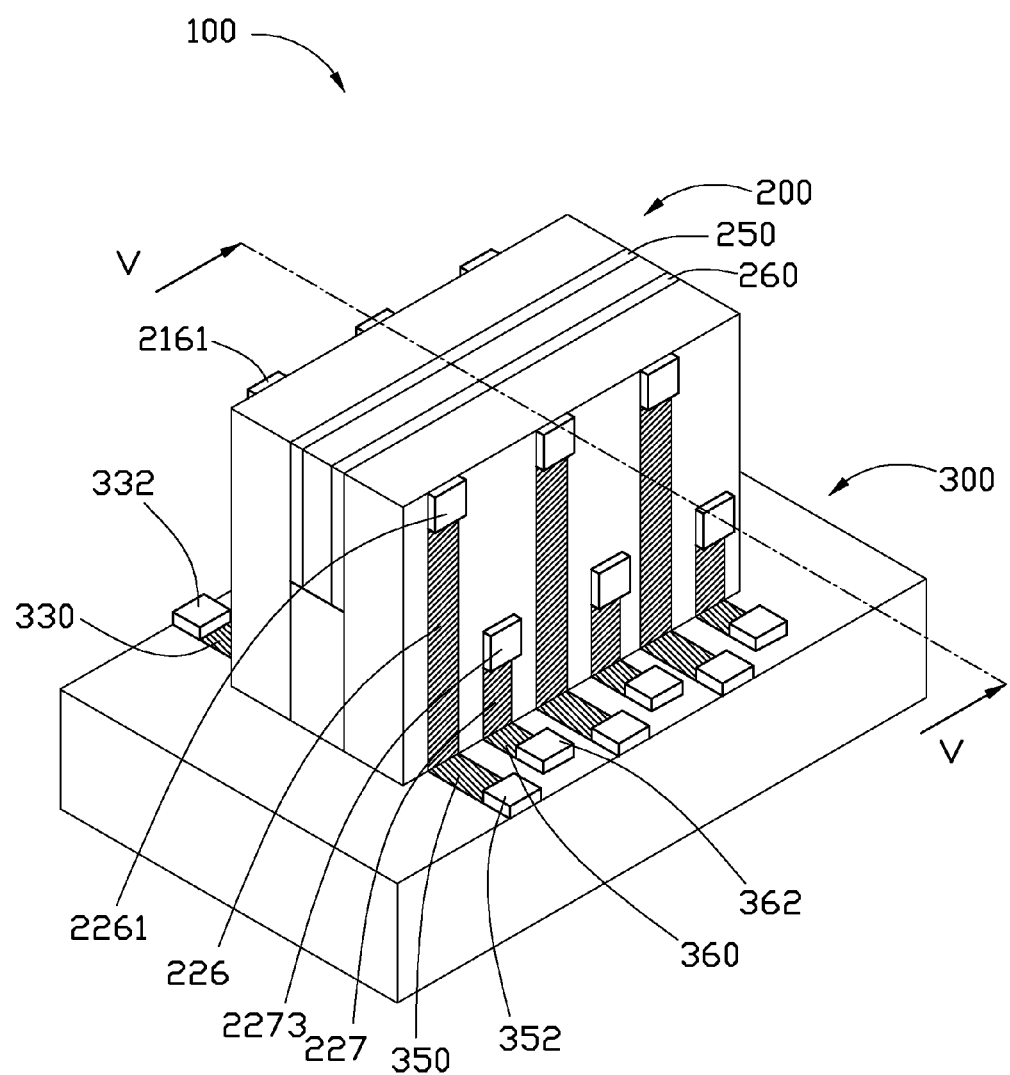
FIG. 1 is a perspective view of a micro electromechanical system (MEMS) connector assembly according to one embodiment of the present disclosure, the micro electromechanical system connector including a MEMS plug connecter and an MEMS socket connecter.
Figure 2:
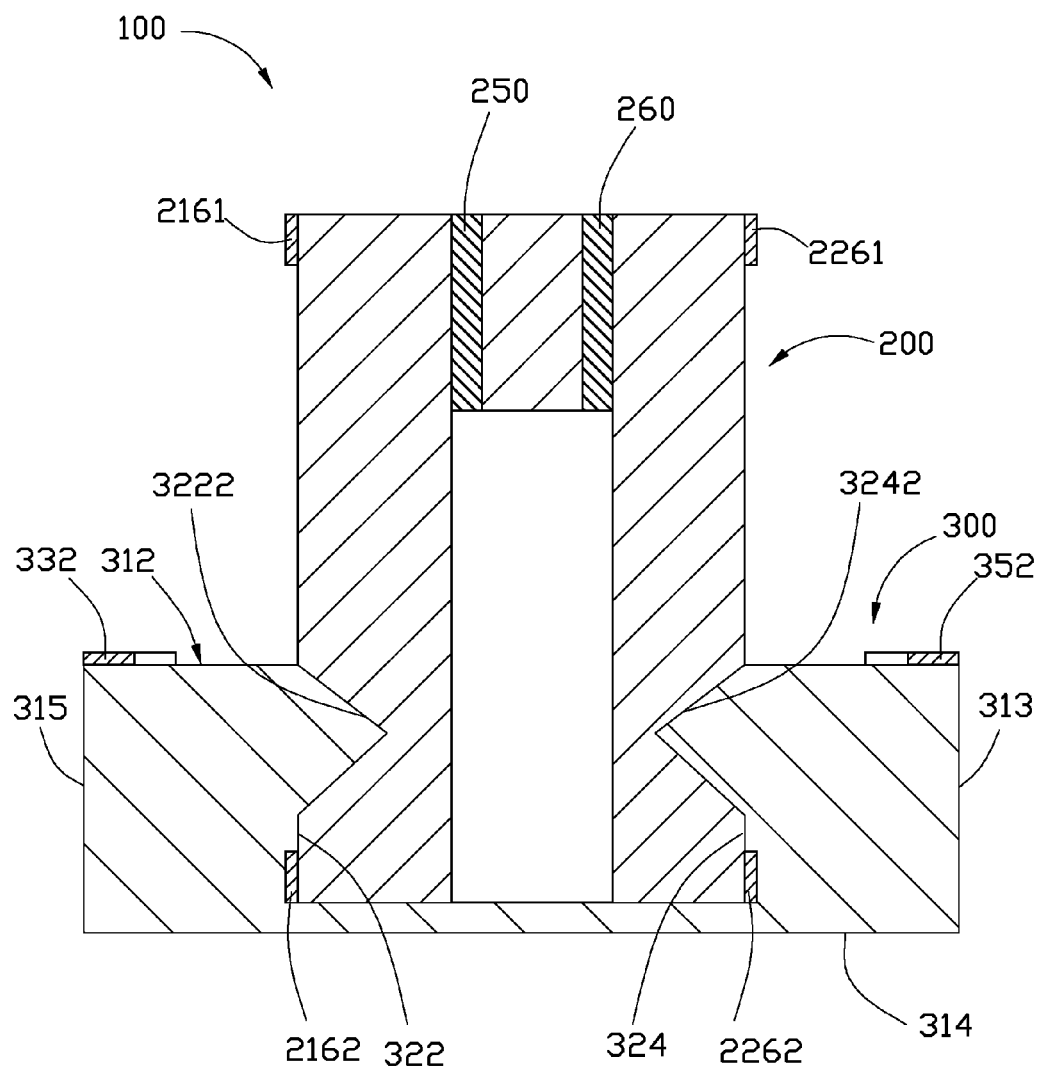
FIG. 2 is a schematic, cross-sectional view of the MEMS connector assembly of FIG. 1 taken along line V-V.
Figure 3:
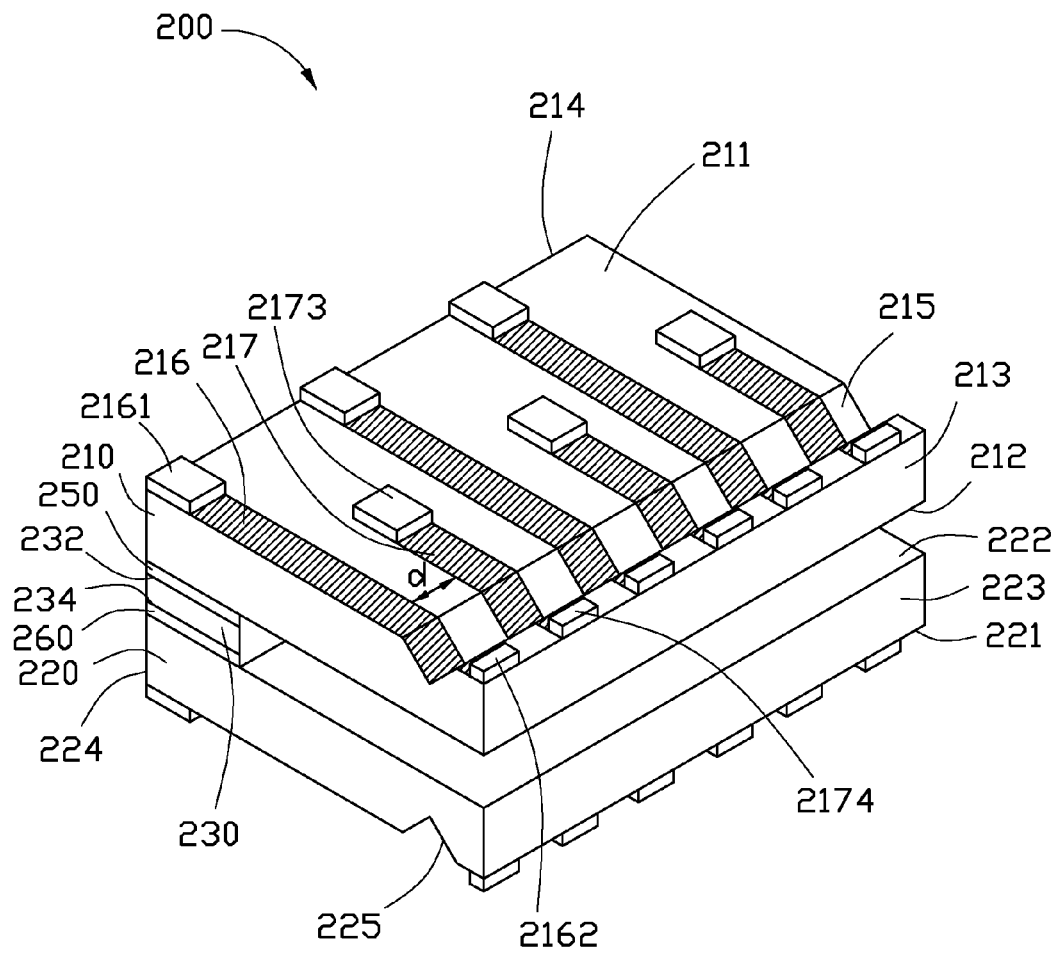
FIG. 3 is a perspective view of the MEMS plug connecter of FIG. 1.
Figure 4:
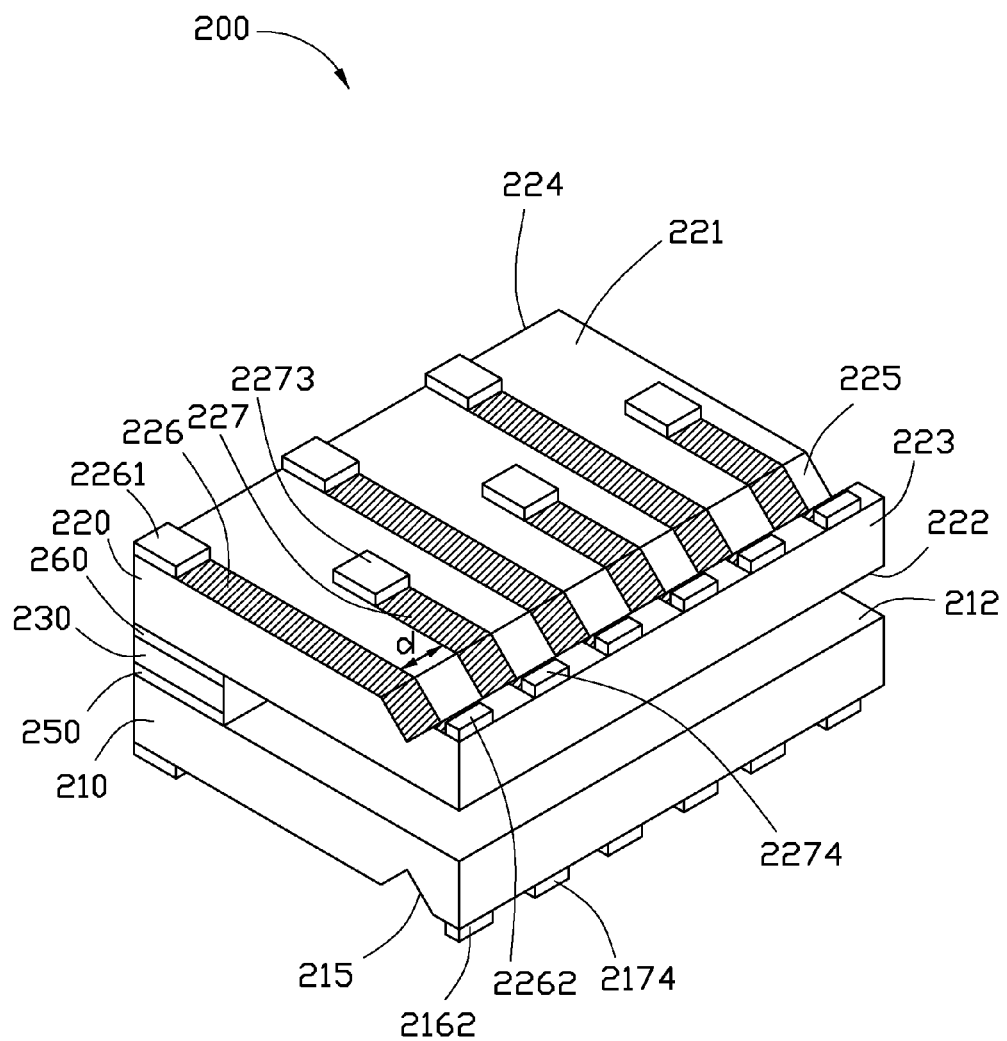
FIG. 4 is a perspective view of the MEMS plug connecter of FIG. 3 in inverse view.

Referring to FIGS. 3 to 4, the MEMS plug connecter 200 includes a first square substrate 210, a second square substrate 220 facing the first substrate 210, a spacing slat 230, a first insulating layer 250, and a second insulating layer 260.

The first substrate 210 includes a first surface 211, a second surface 212 opposite to the first surface 211, a first side wall 213, and a second side wall 214 opposite to the first side wall 213. The first surface 211, the first side wall 213, the second surface 212, and the second side wall 214 are connected end to end in that order.

A first V-shaped groove 215 is defined in the first surface 211 of the first substrate 210 near to the first side wall 213. The first groove 215 extends along a first direction approximately parallel to the first side wall 213 of the first substrate 210.

A plurality of first conductive strips 216 and a plurality of second conductive strips 217 are provided to be formed on the first surface 211 of the first substrate 210. The first and the second conductive strips 216, 217 are alternately arranged in parallel with each other. The first conductive strips 216 extend from the first side wall 213 to the second side wall 214 along a second direction approximately perpendicular to the first direction. The second conductive strips 217 extend from the first side wall 213 to the center part of the first surface 211 of the first substrate 210 also along the second direction. That is, the first conductive strips 216 are longer than the second conductive strips 217. Each of the first and the second conductive strips 216, 217 includes two opposite ends (not labeled). Two ends of each of the first and the second conductive strips 216, 217 are respectively positioned at two opposite sides of the first groove 215.

A plurality of first soldering pads 2161 and a plurality of second soldering pads 2262 are provided to be formed at the two opposite ends of each first conductive strip 216, correspondingly. The first and the second soldering pads 2161, 2162 are electrically connected to the first conductive strips 216. The first soldering pads 2161 are positioned to be adjacent to the second side wall 214 of the first substrate 210 and aligned with one another. The second soldering pads 2162 are arranged between the first side wall 213 and the first groove 215 and aligned with one another.

A plurality of third soldering pads 2173 and a plurality of fourth soldering pads 2174 are provided to be formed at the two opposite ends of each second conductive strip 217, correspondingly. The third and the fourth soldering pads 2173, 2174 are electrically connected to second conductive strips 217. The third soldering pads 2173 are positioned in a middle part of the first surface 211 of the first substrate 210 and aligned with one another. The fourth soldering pads 2174 are also arranged between the first side wall 213 and the first groove 215 and aligned with the second soldering pads 2162.

In this embodiment, the first conductive strips 216 and the second conductive strips 217, the first, second, third and the fourth soldering pads 2161, 2162, 2173, 2174 are made of electrically conductive materials such as silver or copper. In this embodiment, each pad 2161, 2162, 2173, 2174 and each conductive strip 216, 217 have a same width. Alternatively, the first and the third pads 2161, 2173 are respectively wider than the first and the second conductive strips 216, 217. Since the first conductive strips 216 are longer than the second conductive strips 217 and the first and the third pads 2161, 2173 are zigzag arranged, narrower intervals "d" between the first and the second conductive strips 216, 217, for example 100 microns, can easily be achieved without reducing the width of each of the first and the third pads 2161, 2173.

The second substrate 220 is symmetrical with the first substrate 210 according to a plane (not shown) sandwiched therebetween. The second substrate 220 includes a third surface 221, a fourth surface 222 opposite to the third surface 221, a first lateral wall 223, and a second lateral wall 224 opposite to the first lateral wall 223. The third surface 221, the first lateral wall 223, the fourth surface 222, and the second lateral wall 224 are connected end to end in that order.

A second V-shaped groove 225 is defined in the third surface 221 of the second substrate 220 near to the first lateral wall 223 of the second substrate 220. The second groove 225 extends along the first direction approximately parallel to the first lateral wall 223 of the second substrate 220.

A plurality of third conductive strips 226 and a plurality of fourth conductive strips 227 are provided to be formed on the third surface 221 of the second substrate 220. The third and the fourth conductive strips 226, 227 are alternately arranged in parallel with each other. The third conductive strips 226 extend from the first lateral wall 223 to the second lateral wall 224 along the second direction. The fourth conductive strips 227 extend from the first lateral wall 223 to the center part of the third surface 221 of the second substrate 220 along the second direction. That is, the third conductive strips 226 are longer than the fourth conductive strips 227. Each of the third and the fourth conductive strips 226, 227 includes two opposite ends (not labeled). Two ends of each of the third and the fourth conductive strips 226, 227 are respectively positioned at two opposite sides of the second groove 225.

A plurality of first welding pads 2261 and a plurality of second welding pads 2262 are provided to be formed at the two opposite ends of each third conductive strip 226, correspondingly. The first and the second welding pads 2261, 2262 are electrically connected to the third conductive strips 226. The first welding pads 2261 are positioned to be adjacent to the second lateral wall 224 of the second substrate 220 and aligned with one another. The second welding pads 2262 are arranged between the first lateral wall 223 and the second groove 225 and aligned with one another.

A plurality of third welding pads 2273 and a plurality of fourth welding pads 2274 are provided to be formed at the two opposite ends of each fourth conductive strip 227, correspondingly. The third and the fourth welding pads 2173, 2174 are electrically connected to the fourth conductive strips 227. The third welding pads 2273 are positioned in a middle part of the third surface 221 of the second substrate 220 and aligned with one another. The fourth welding pads 2274 are also arranged between the first lateral wall 223 and the second groove 225 and aligned with the second welding pads 2262.

Since the arrangements of the second groove 225, the third and the fourth conductive strips 226, 227, and the welding pads 2261, 2262, 2273, 2274 of the second substrate 220 are respectively the same as that of the first groove 215, the first and the second conductive strips 216, 217, and the soldering pads 2161, 2162, 2173, 2174 of the first substrate 210, the second substrate 220 has the same advantages of the first substrate 210.

The spacing slat 230 includes a first supporting surface 232 and an opposite supporting surface 234. The supporting surface 232 and the supporting surface 234 of the spacing slat 230 are respectively covered by the first insulating layer 250 and the second insulating layer 260.

The spacing slat 230 and the first and the second insulating layers 250, 260 are positioned to be near to the second side wall 214 and the second lateral wall 224 and sandwiched between the second surface 212 of the first substrate 210 and the third surface 222 of the second substrates, 220. The spacing slat 230 and the first and the second insulating layers 250, 260 extend along the first direction and configured for spacing the first and the second substrates 210, 220.

In this embodiment, the MEMS plug connecter 200 approximately has a U-shaped configuration in a side wall view. The first and the second substrates 210, 220 are made of materials selected from one of the groups consisted of monocrystalline silicon, polycrystalline silicon, and amorphous silicon. Both the first and the second substrates 210, 220 are resilient due to a high Young's modulus of silicon.

Figure 5:
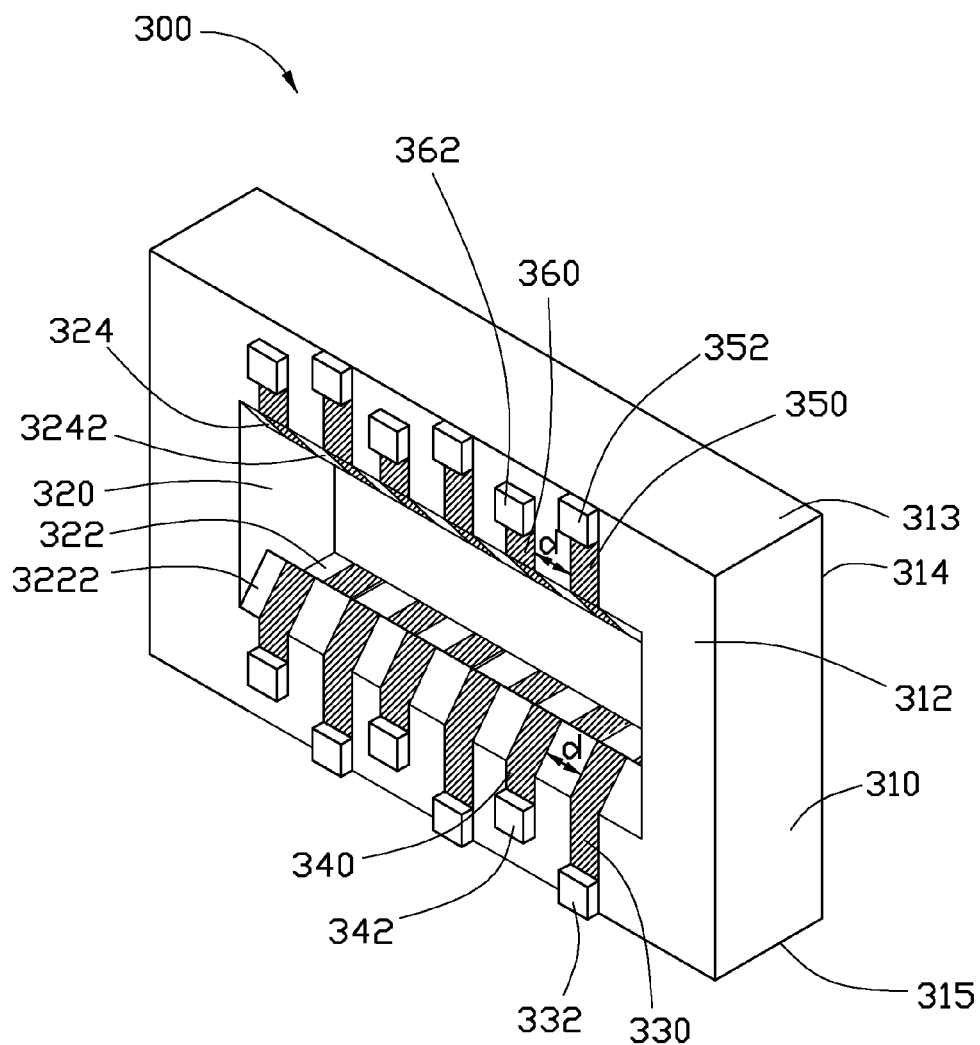
FIG. 5 is a perspective view of the MEMS socket connecter of FIG. 1.

Also referring FIG. 5, the MEMS socket connecter 300 includes a base 310. The base 310 includes top surface 312, a first outer wall 313, a bottom surface 314 opposite to the top surface 312, and a second outer wall 315 opposite to the first outer wall 313. The top surface 312, first outer wall 313, the bottom surface 314, and the second outer wall 315 are connected end to end in that order. The base 310 is made of materials selected from one of the groups consisted of monocrystalline silicon, poly-crystalline silicon, and amorphous silicon.

The top surface 312 of the base 310 defines a square recess 320 configured for securing the one end of the plug connecter 200 far from the spacing slat 230. The recess 320 includes a first internal wall 322 and a second internal wall 324 facing the first internal wall 322. A first protrusion 3222 and a second protrusion 3242 are respectively formed on the first internal wall 322 and the second internal wall 324 adjacent to the entrance of recess 320. In this embodiment, the first protrusion 3222 and the second protrusion 3242 are V-shaped corresponding to the first and the second grooves 215, 225. Each protrusion 3222, 3242 includes two adjacent slopes.

A plurality of fifth conductive strips 330 and a plurality of sixth conductive strips 340 are provided to be formed on the top surface 312, two slopes of the first protrusion 3222, and the first internal wall 322. The fifth and the sixth conductive strips 330, 340 are alternately arranged in parallel with each other. The fifth and the sixth conductive strips 330, 340 extend from one side of the top surface 312 adjacent to the second outer wall 315 to a bottom part of the first internal wall 322. Thus, two opposite ends of each of the fifth and the sixth conductive strips 330, 340 are respectively positioned on the top surface 312 and the first internal wall 322.

A plurality of seventh conductive strips 350 and a plurality of eighth conductive strips 360 are provided to be formed on the top surface 312, a surface of the second protrusion 3242, and the second internal wall 324. The seventh and the eighth conductive strips 350, 360 are alternately arranged in parallel with each other. The seventh and the eighth conductive strips 350, 360 extend from the other side of the top surface 312 adjacent to the first outer wall 313 to a bottom part of the second internal wall 324. Thus, two opposite ends of each of the seventh and the eighth conductive strips 350, 360 are respectively positioned on the top surface 312 and the second internal wall 324.

A plurality of fifth, sixth, seventh, eighth soldering pads 332, 342, 352, 362 are respectively connected to the fifth, sixth, seventh, eighth conductive strips 330, 340, 350, 360 on the top surface 312 of the base 310 far from the recess 320. The fifth and sixth soldering pads 332, 342 are spaced from the seventh and eighth soldering pads 352, 362 by the recess 320.

In this embodiment, the fifth soldering pads 332 are aligned with one another adjacent to the second outer wall 315. The sixth soldering pads 342 are aligned with one another near the fifth soldering pads 332. Thus, the fifth and the sixth soldering pads 332, 342 are arranged in zigzag fashion near the second outer wall 315.

The seventh soldering pads 352 are aligned with one another adjacent to the first outer wall 313. The eighth soldering pads 362 are aligned with one another near the seventh soldering pads 352. Thus, the seventh and the eighth soldering pads 352, 362 are arranged in zigzag fashion near the first outer wall 313.

In this embodiment, each pad 332, 342, 352, 362 and each conductive strip 330, 340, 350, 360 have the same width. Alternatively, each pad 332, 342, 352, 362 is wider than each conductive strip 330, 340, 350, 360. Since the fifth conductive strips 330 are longer than the sixth conductive strips 340 and the fifth and the sixth pads 332, 342 are zigzagged, narrower intervals "d" between the fifth and the sixth conductive strips 330, 340, for example 100 microns, can easily be achieved without reducing the width of each pad 332, 342. Similarly, since the seventh conductive strips 350 are longer than the eighth conductive strips 360 and the seventh and the eighth pads 352, 362 are zigzagged, narrower intervals "d" between the seventh and the eighth conductive strips 350, 360, for example 100 microns, can easily be achieved without reducing the width of each pad 352, 362.

When one end of the plug connecter 200 adjacent the grooves 215, 225 is pushed by an external force towards the recess 320, the edges of the first and the second substrates 210, 220 adjacent the grooves 215, 225 can slide along one slope until the end of the plug connecter 200 is received in the bottom of the recess 320 and the two protrusions 3222, 3242 are correspondingly received in the two grooves 215, 225. Thus, the MEMS plug connecter 200 is secured in the MEMS socket connecter 300 by an engagement of the two protrusions 3222, 3242 and the two grooves 215, 225. When the edges of the first and the second substrates 210, 220 are pulled to slide along the other slope, the MEMS plug connecter 200 can easily be removed from the MEMS socket connecter 300. Thus, an electrical connection between the MEMS plug connecter 200 and the MEMS socket connecter 300 is cut off.

When the MEMS plug connecter 200 is secured in the MEMS socket connecter 300, the second and the fourth soldering pads 2162, 2174 and the second and the fourth welding pads 2262, 2274 are respectively contacted with and electrically connected to the fifth, sixth, seventh, eighth conductive strips 330, 340, 350, 360. Furthermore, parts of the first and the second conductive strips 216, 217 in the first grooves 215 and parts of the third and the fourth conductive strips 226, 227 in the second grooves 225 are respectively contacted with and electrically connected to the fifth and the sixth conductive strips 330, 340 of the first protrusion 3222 and the seventh and the eighth conductive strips, 350, 360 of the second protrusion 3242.

Referring FIGS. 6 to 15 a method for manufacturing the MEMS plug connecter 200 is shown.

Figure 6:
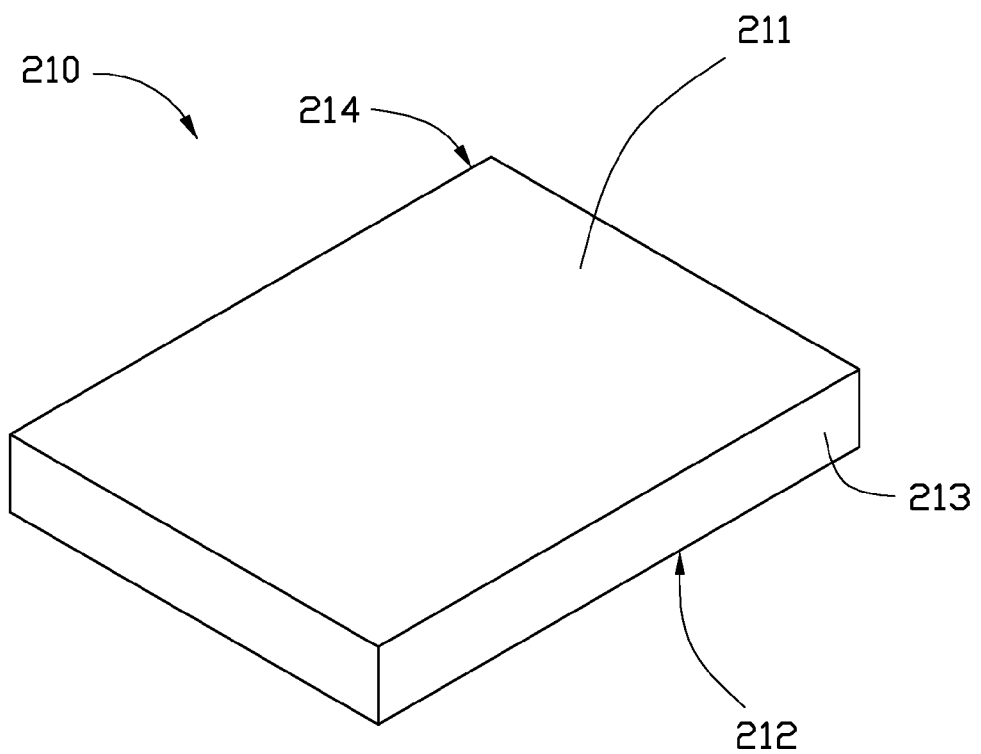
FIGS. 6 to 15 showing a method of manufacturing the MEMS plug connecter of FIG. 1.

As shown in FIG. 6, a first substrate 210 is provided. The first substrate 210 includes a first surface 211 and a second surface 212 opposite to the first surface 211, a first side wall 213 and a second side wall 214 opposite to the first side wall 213.

Figure 7:
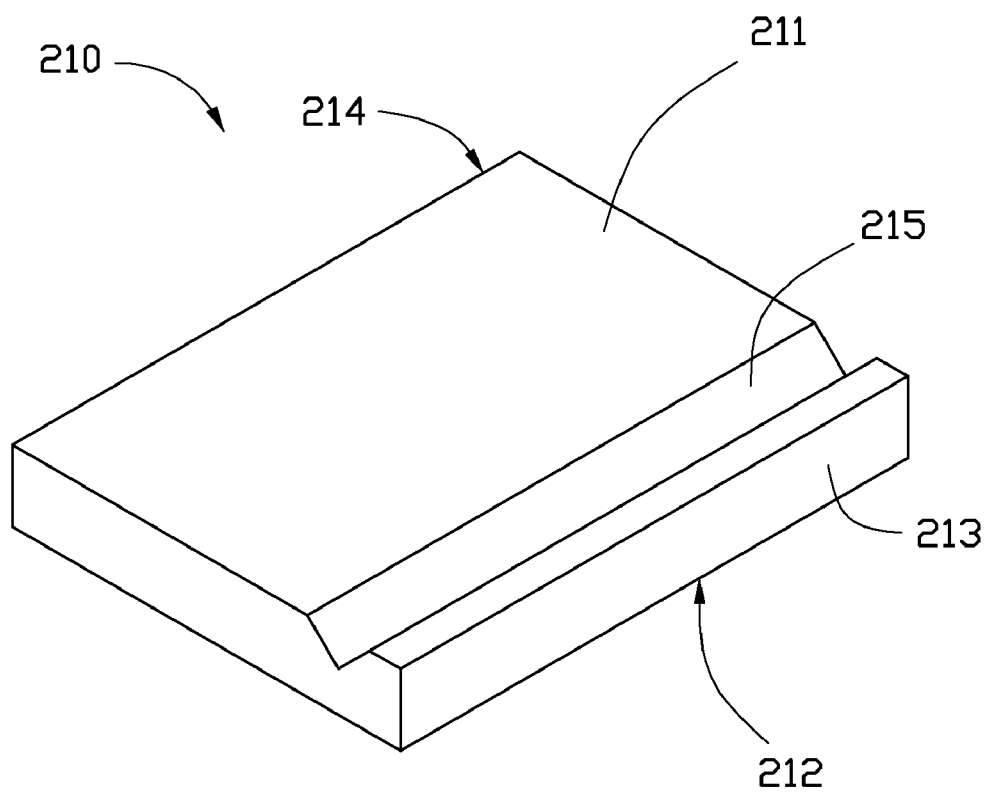

As shown in FIG. 7, an etching process is performed to form a first groove 215 in the first surface 211 of the first substrate 210. The first groove 215 is positioned near to the first side wall 213. In one embodiment, the etching process is dry etching process such as inductively coupled plasma etching (ICPE), or deep reactive ion etching (DRIE). Alternatively, the etching process is wet etching process.

Figure 8:
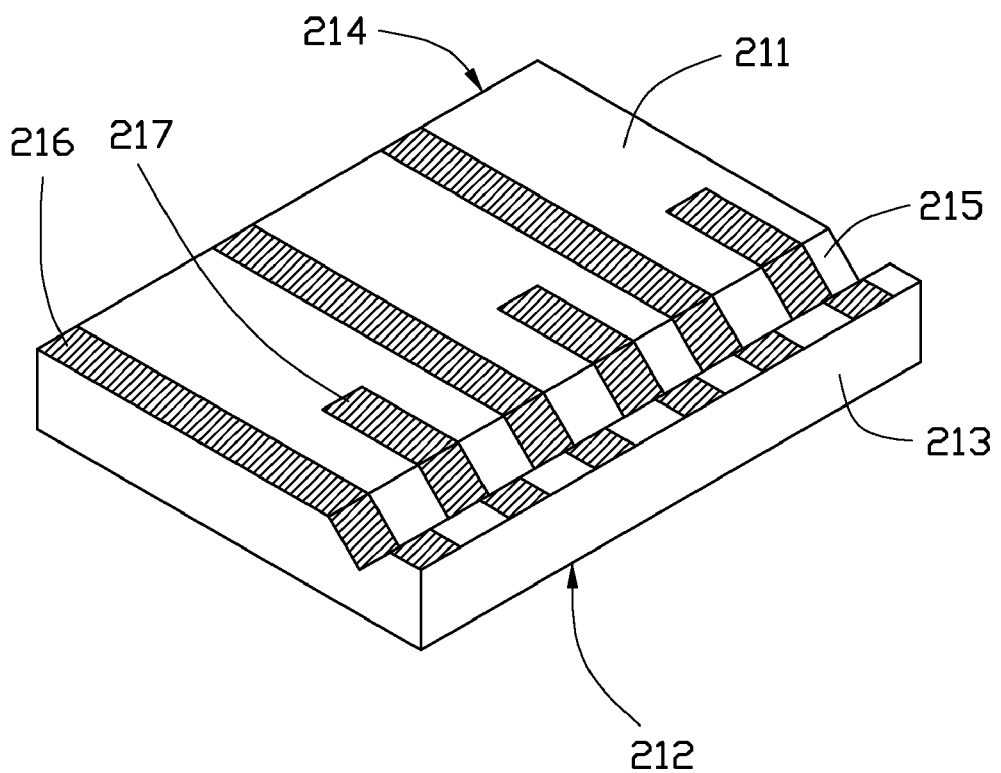

As shown in FIG. 8, a plurality of first conductive strips 216 and a plurality of second conductive strips 217 are formed on the first surface 211 by a liftoff process. Each of the first and the second conductive strip 216, 217 extends along a direction perpendicular to the first groove 215. The first and the second conductive strip 216, 217 are alternately arranged.

Figure 9:
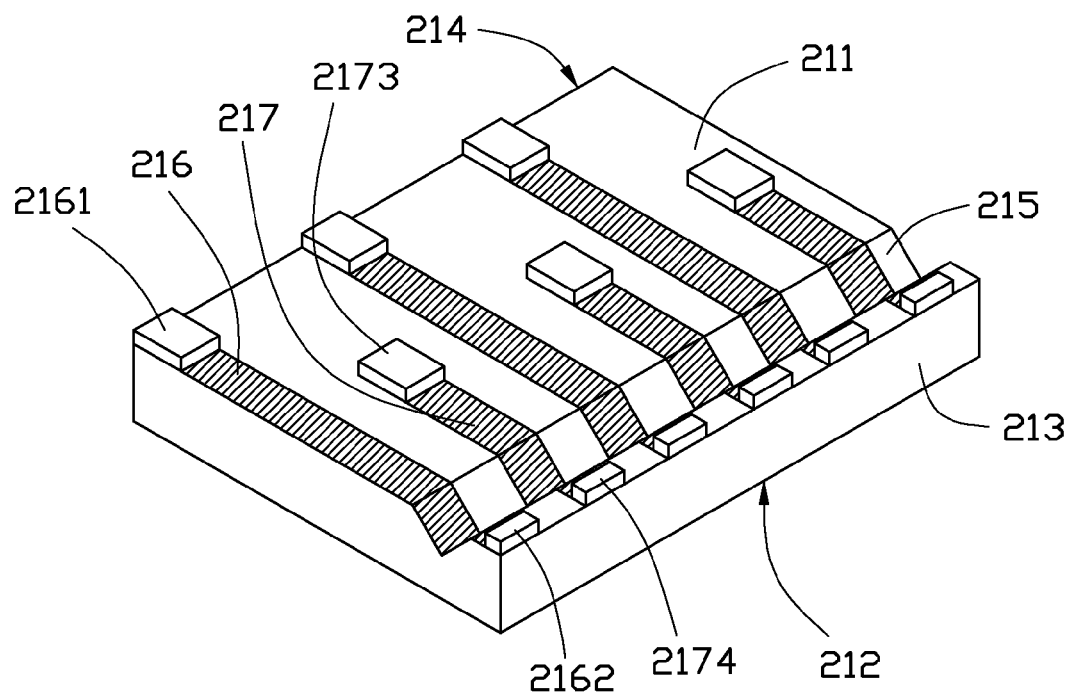

As shown in FIG. 9, a plurality of soldering pads 2161, 2162, 2173, 2174 are formed on two opposite ends of each conductive strip 216, 217 by a plating process.

Figure 10:
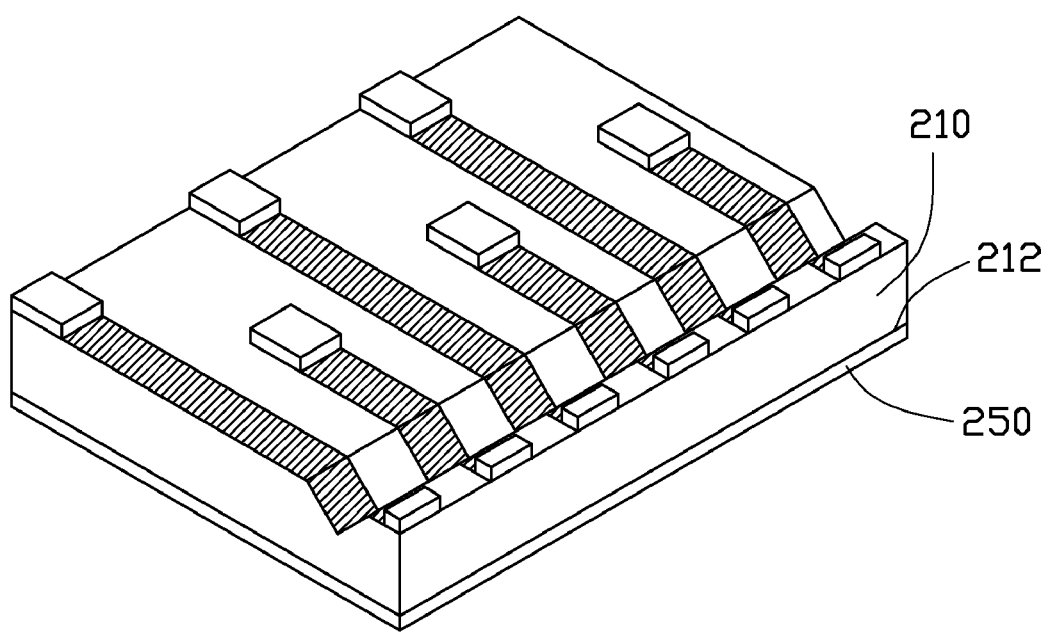

As shown in FIG. 10, an insulating layer 250 is formed to cover the second surface 212 of the first substrate 210 by chemical vapor deposition (CVD) or physical vapor deposition (PVD). Alternatively, the insulating layer 250 formed to cover only part of the second surface 212 far from the first groove 215.

Figure 11:
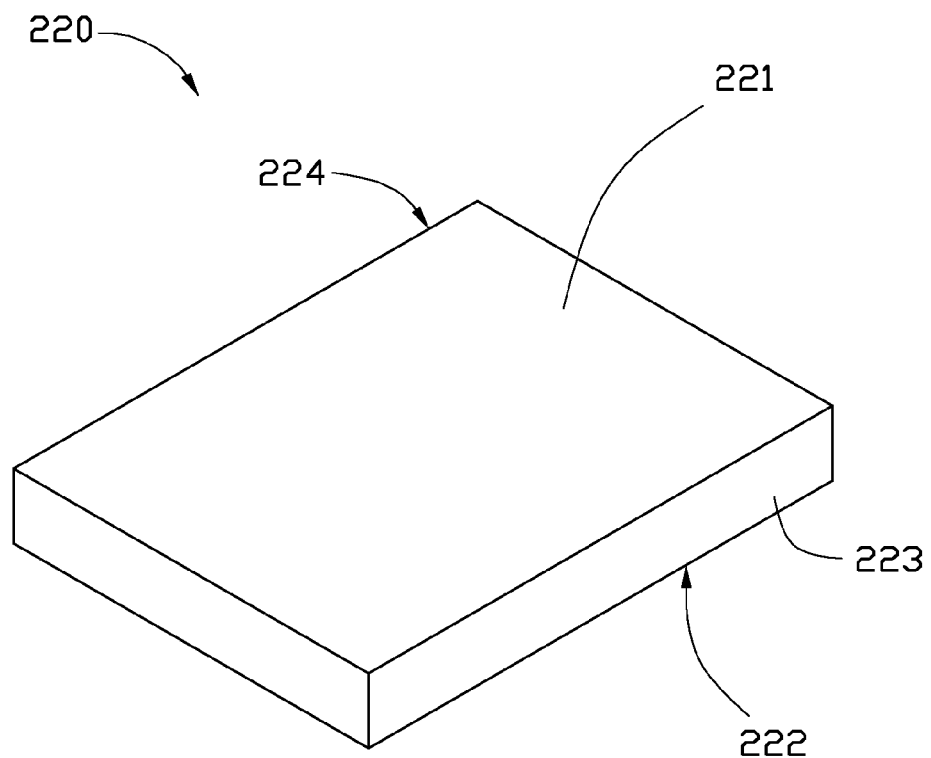

As shown in FIG. 11, a second substrate 220 is provided. The second substrate 220 includes a third surface 221, a fourth surface 222 opposite to the third surface 221, a first lateral wall 223 and a second lateral wall 224 opposite to the first side wall 223.

Figure 12:
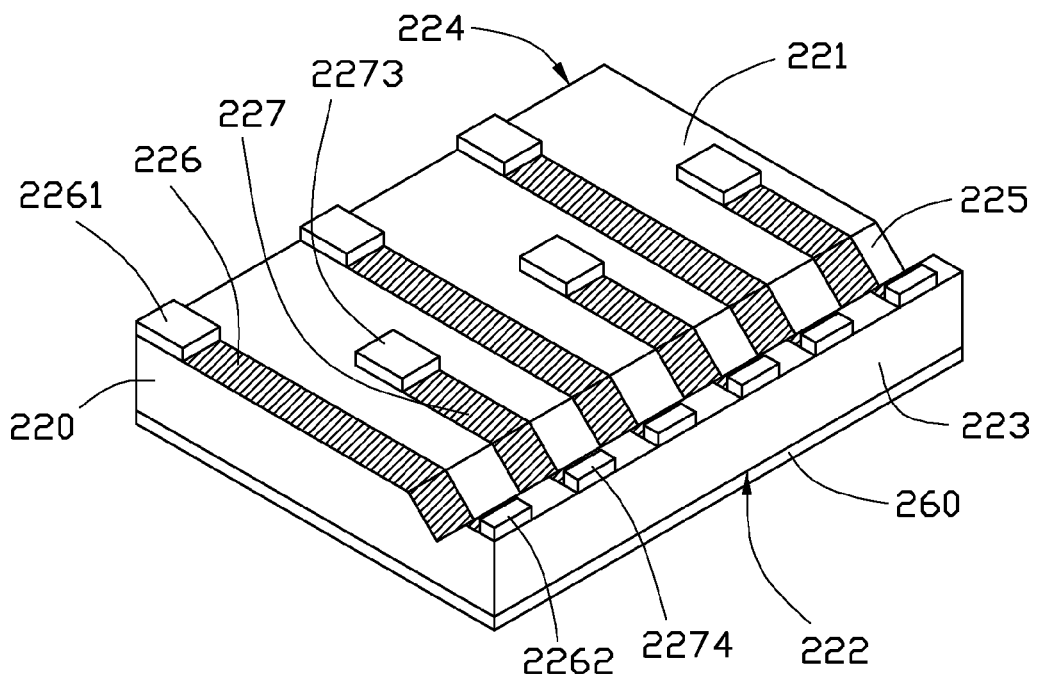

As shown in FIG. 12, a second groove 225, a plurality of third conductive strips 226 and a plurality of third conductive strips 227, a plurality of soldering pads 2261, 2262, 2273, 2274, and a second insulating layer 260 are formed on the second substrate 220 in that order by repeating the same processes as above described and respectively shown from FIGS. 7 to 10.

Figure 13:
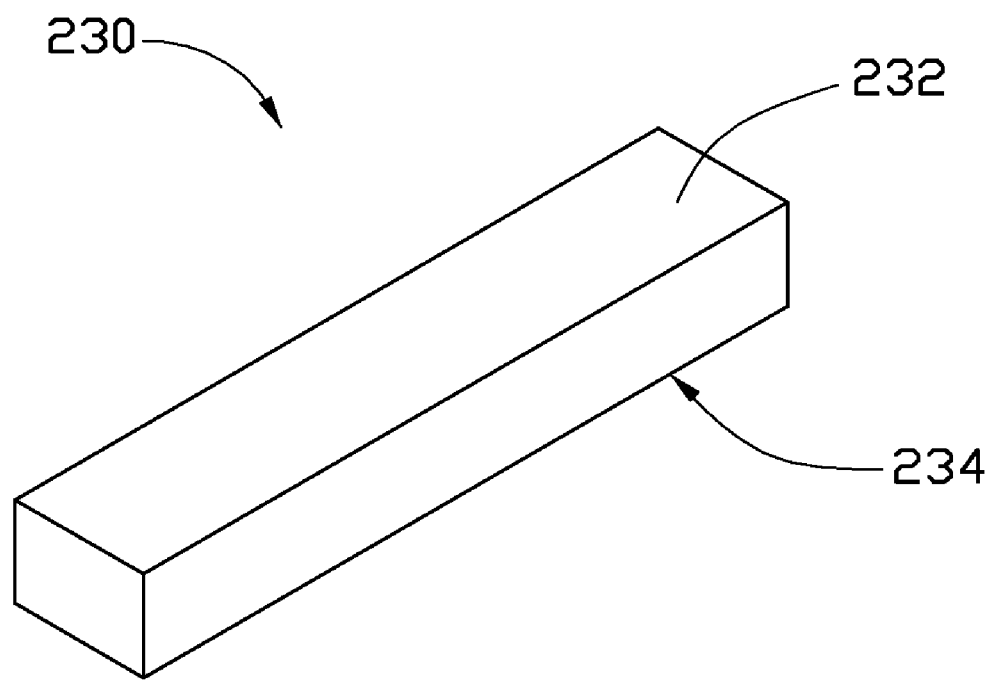

As shown in FIG. 13, a spacing slat 230 is provided. The spacing slat 230 includes two opposite surfaces 232, 234.

Figure 14:
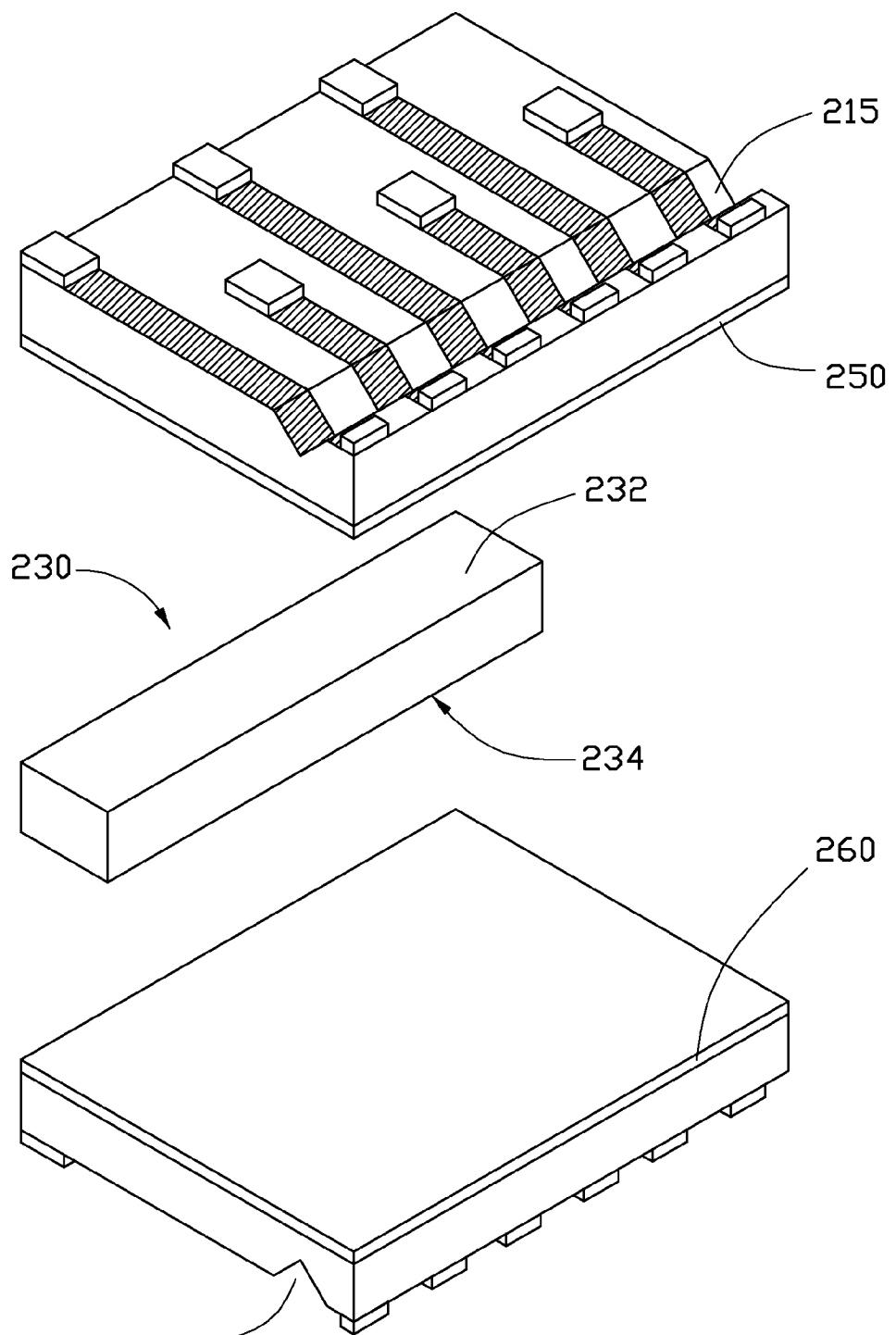

As shown in FIG. 14, the insulating layer 250 of the first substrate 210 and the second insulating layer 260 of the second substrate 220 are positioned to be respectively facing the two opposite surfaces 232, 234 of the slat 230. The slat 230 is positioned to be parallel to the first and the second grooves 215, 225 and far from the first and the second groove 215, 225.

Figure 15:
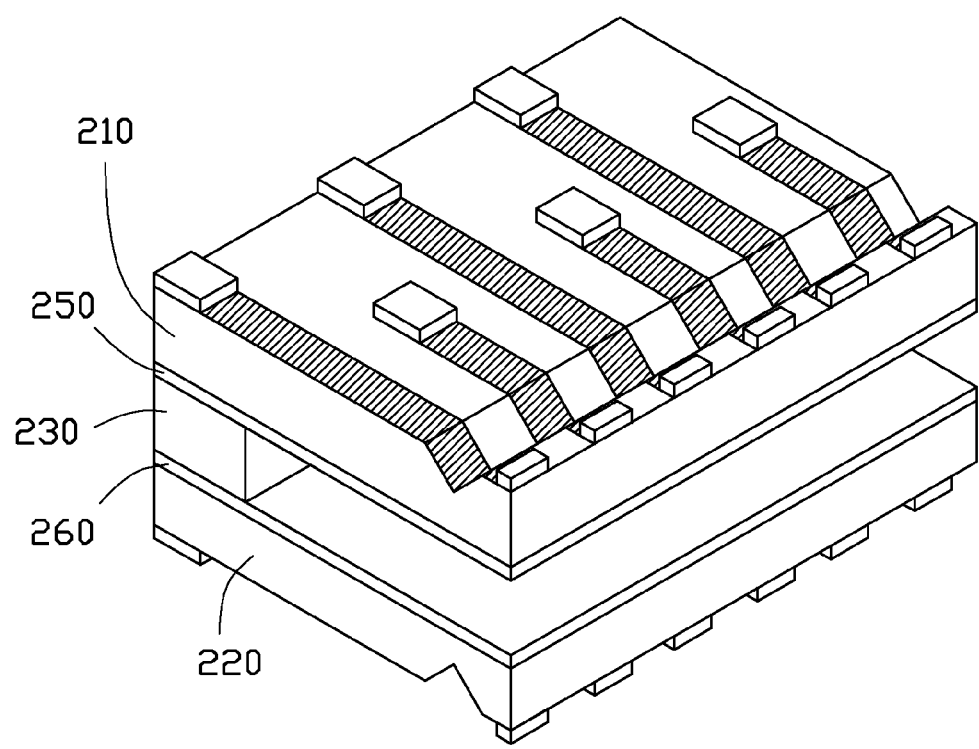
Figure 16:
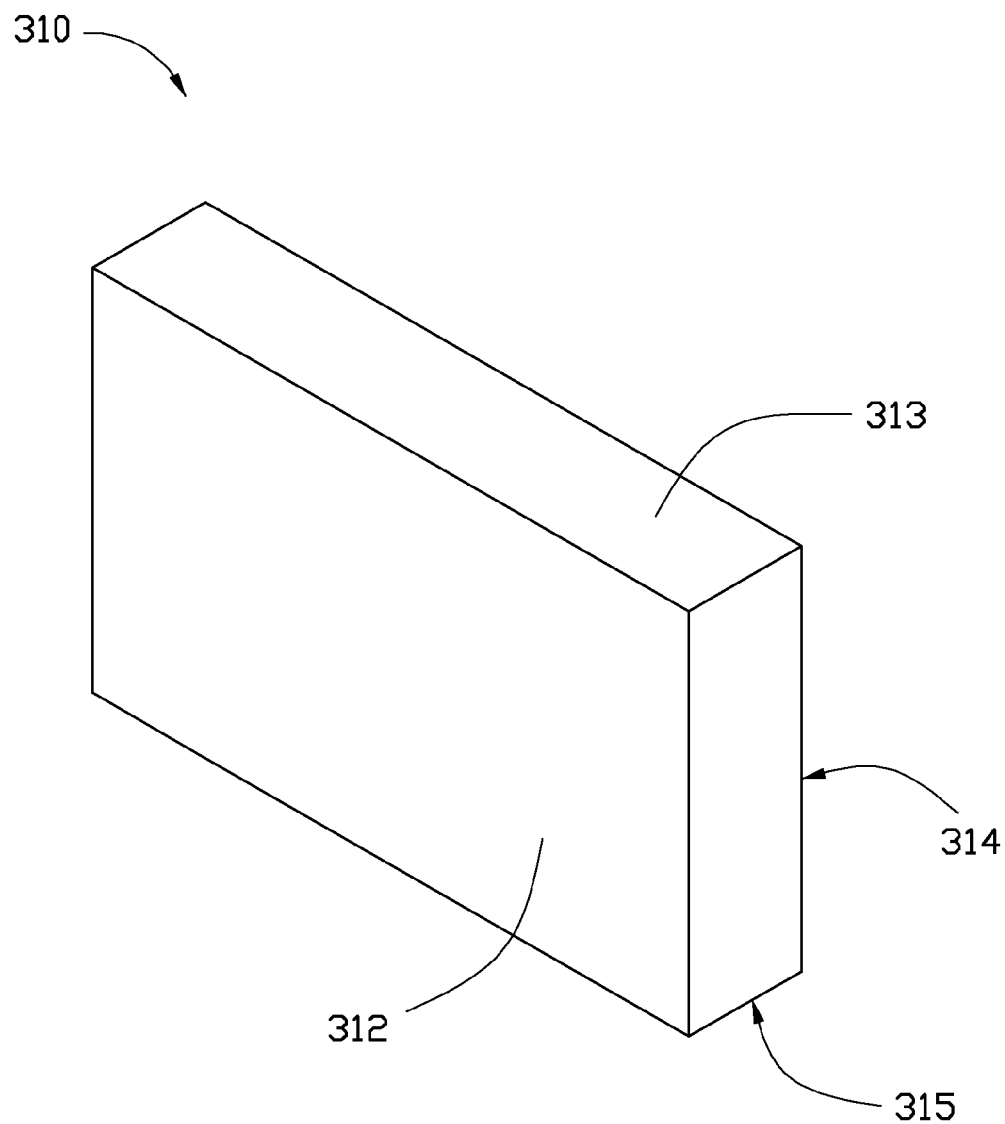
FIGS. 16 to 19 showing a method of manufacturing the MEMS socked connecter of FIG. 1

As shown in FIG. 15, the first insulating layer 250, spacing slat 230 and second insulating layer 260 are fixed together by anodic bonding, low temperature bonding or silicon-to-silicon direct bonding (SDB). Then, parts of the first insulating layer 250 and second insulating layer 260 which are not contacted with the spacing slat 230 are removed by etching.

Referring to FIGS. 16 to 20, a method for manufacturing the MEMS socket connecter 300 is shown.

Figure 17:
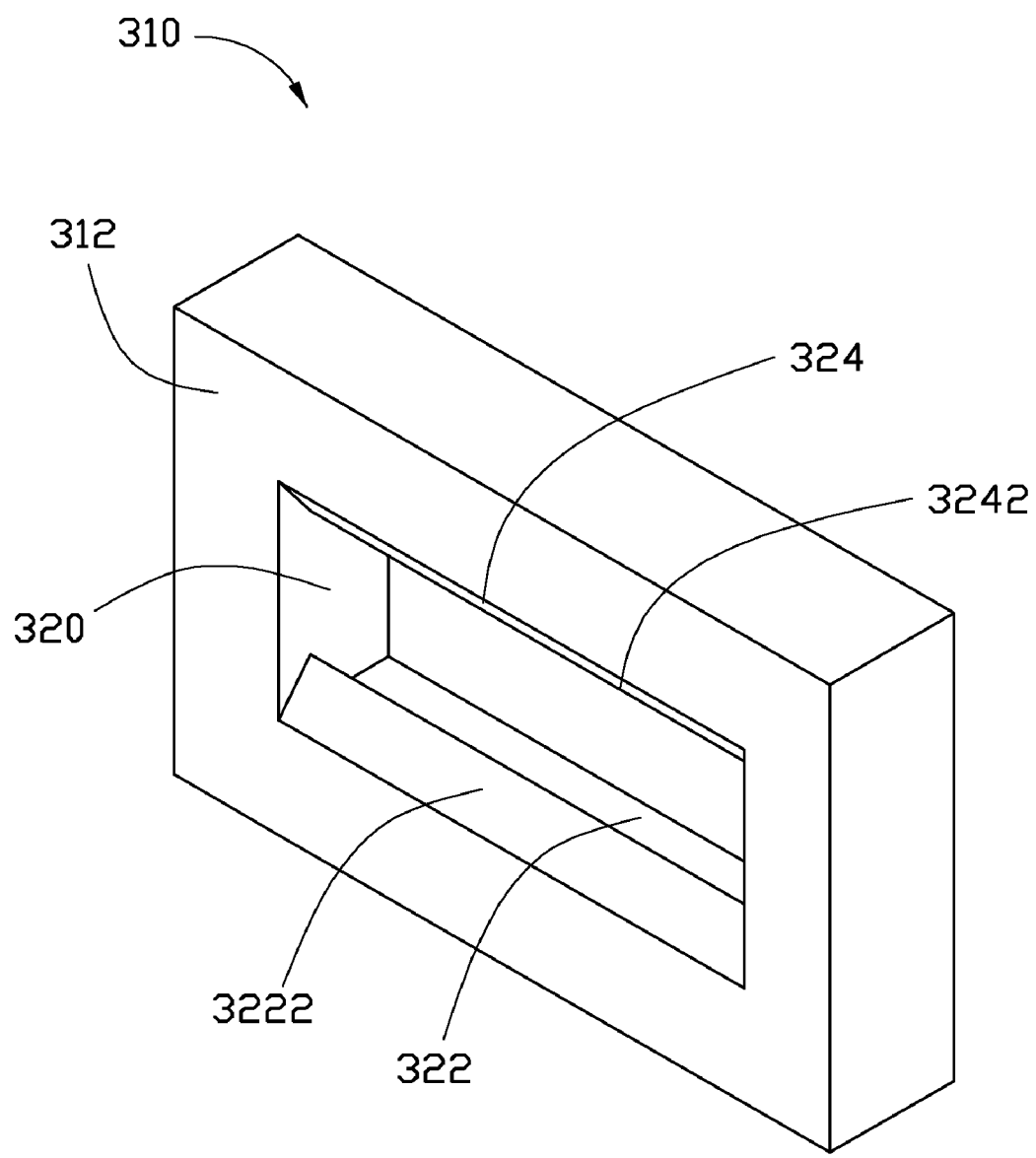

As shown in FIG. 56, a base 310 is provided. The base 310 includes a top surface 312, a bottom surface 314 opposite to the top surface 312, a first outer wall 313 and a second outer wall 315 opposite to the first outer wall 313. As shown in FIG. 17, a recess 320 is formed in the top surface 312 of the base 310 by an etching process. The recess 320 includes a first internal wall 322 and a second internal wall 324 facing the first internal wall 322. The first internal wall 322 defines a first protrusion 3222 adjacent to the entrance of the recess 320. The second internal wall 324 defines a second protrusion 3242 adjacent to the entrance of the recess 320. In one embodiment, the etching process is dry etching process such as inductively coupled plasma etching (ICPE), or deep reactive ion etching (DRIE). Alternatively, the etching process is wet etching process.

Figure 18:
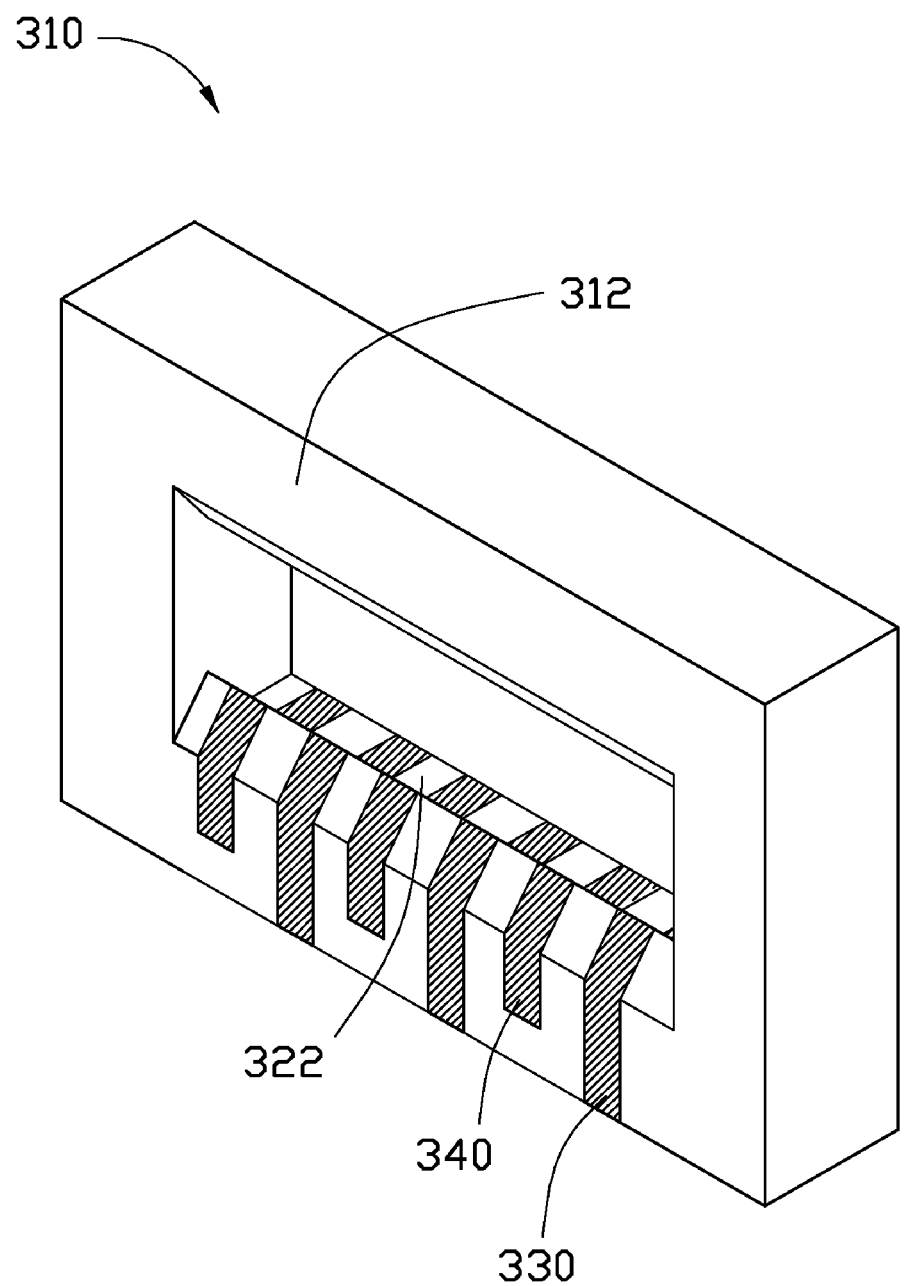

As shown in FIG. 18, a plurality a fifth conductive strips 330 and a plurality of sixth conductive strips 340 are formed on the first surface 312 and the first internal wall 322 of the base 310 by a first liftoff process.

Figure 19:
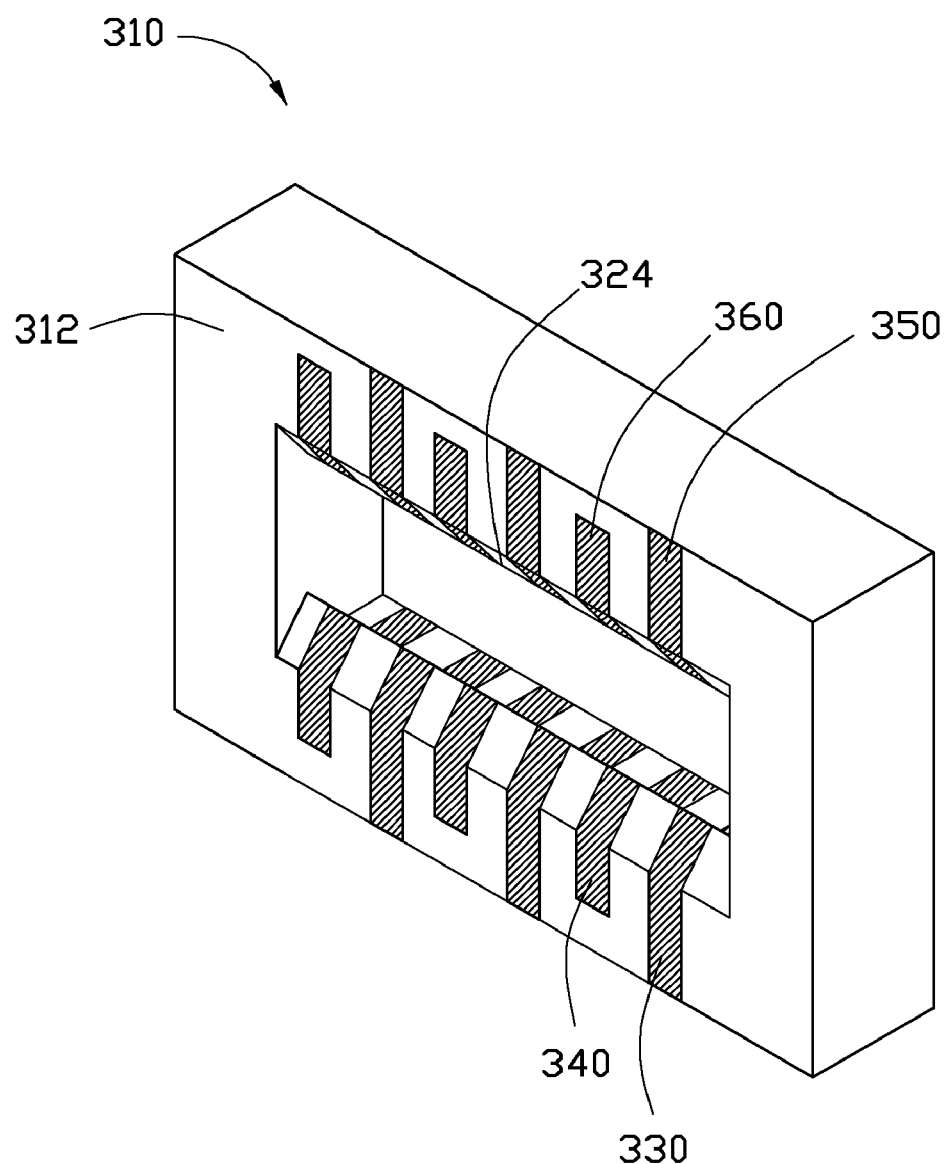

As shown in FIG. 19, a plurality a fifth conductive strips 350 and a plurality of sixth conductive strips 360 are formed on the first surface 312 and the second internal wall 324 of the base 310 by second liftoff process.

Then, a plurality of soldering pads 332, 342, 352, 362 are formed at one end of each of the fifth, sixth, seventh, eighth conductive strips 350 by plating (not shown). Therefore the MEMS socket connecter 300 as shown in FIG. 5 is obtained.

It is to be understood, however, that even though numerous characteristics and advantages of certain inventive embodiments have been set out in the foregoing description, together with details of the structures and functions of the embodiments, the disclosure is illustrative only; and that changes may be made in detail, especially in matters of arrangement of parts within the principles of present invention to the full extent indicated by the broad general meaning of the terms in which the appended claims are expressed.

What is claimed is:

1. A micro electromechanical system connecter comprising:
   a U-shaped plug connecter comprising:
   a first substrate;
   a second substrate;

a spacing element sandwiched between the first and the second substrates, the spacing element positioned at one ends of the first and the second substrates;

two parallel grooves respectively defined in outer surfaces of the first and the second substrates at the other ends the first and the second substrates and extending along a first direction; and a plurality of parallel first electrodes formed on the outer surfaces of the first and the second substrates extending along a second direction perpendicular to the first direction;

a socket connecter comprising:

a base comprising a top surface;

a recess defined in the top surface, the recess comprising a first internal wall and an opposite second internal wall;

two protrusions respectively formed on the first internal wall and the second internal wall adjacent to the entrance of the recess; and a plurality of parallel second electrodes formed on the base spatially corresponding to the plurality of first electrodes, some of the plurality of second electrodes extending from the top surface to the first internal wall, others of the plurality of second electrodes extending from the top surface to the second internal wall.

2. The micro electromechanical system connecter of claim 1, wherein the two protrusions are respectively received in the two grooves.

3. The micro electromechanical system connecter of claim 1, wherein the plurality of first electrodes are electrically coupled to the plurality of second electrodes, respectively.

4. The micro electromechanical system connecter of claim 1, further comprising a plurality of electrically conductive pads formed on one end of each one of the plurality of first electrodes and the plurality of second electrodes.

5. The micro electromechanical system connecter of claim 4, wherein some of the plurality of electrically conductive pads are arranged in a staggered fashion.

6. The micro electromechanical system connecter of claim 5, wherein each one of the plurality of electrically conductive pads is wider than each one of the plurality of first electrodes and the plurality of second electrodes.

7. A plug connecter comprising:

a first substrate comprising a first surface, a first side wall, a second surface opposite to the first surface, and a second side wall opposite to the first side wall connected end to end in that order, a first groove defined in the first surface of the first substrate adjacent to the first side wall, a plurality of first conductive strips and a plurality of second conductive strips alternately formed on the first surface of the first substrate crossing the first groove;

a second substrate comprising a third surface, a first lateral wall, a fourth surface opposite to the third surface, and a second lateral wall opposite to the first lateral wall connected end to end in that order, a second groove defined in the third surface of the second substrate adjacent to the first lateral wall of the second substrate, a plurality of third conductive strips and a plurality of fourth conductive strips alternately formed on the third surface of the second substrate crossing the second groove; and a spacing slat sandwiched between the second surface of the first substrate and the fourth surface of the second substrate adjacent to the second side wall of the first substrate and the second lateral wall of the second substrate.

8. The plug connecter of claim 7, wherein the first and the second substrates are made of materials selected from one of the groups consisting of mono-crystalline silicon, polycrystalline silicon, and amorphous silicon.

9. The plug connecter of claim 7, wherein the first and the second grooves extend along a first direction, and the plurality of first, second, third and fourth conductive strips extend along a second direction perpendicular to the first direction.

10. The plug connecter of claim 7, wherein the first and the second grooves are V-shaped.

11. The plug connecter of claim 7, wherein two ends of each one of the plurality of first and the second conductive strips are positioned at opposite sides of the first groove, each one of the plurality of third and the fourth conductive strips are positioned at opposite sides of the second groove.

12. The plug connecter of claim 7, wherein the plurality of first conductive strips are longer than the plurality of second conductive strips, the plurality of third conductive strips are longer than the plurality of fourth conductive strips.

13. The plug connecter of claim 7, further comprising a plurality of first soldering pads and a plurality of second soldering pads formed on the opposite ends of each one of plurality of first conductive strips, a plurality of third soldering pads and a plurality of fourth soldering pads formed on the opposite ends of each one of the plurality of second conductive strips.

14. The plug connecter of claim 13, wherein the plurality of first and third soldering pads are arranged in a staggered fashion adjacent to the second side wall of the first substrate.

15. The plug connecter of claim 13, further comprising a plurality of first soldering pads and a plurality of second soldering pads formed on the opposite ends of each one of plurality of third conductive strips, a plurality of third soldering pads and a plurality of fourth soldering pads formed on the opposite ends of each one of the plurality of fourth conductive strips.

16. A socket connecter comprising:

a base comprising a top surface and a bottom surface;

a recess defined in the top surface, the recess comprising a first internal wall and an opposite second internal wall;

a first protrusion formed on the first internal wall adjacent to the entrance of the recess, the first protrusion comprising two adjacent first slopes;

a second protrusion formed on the second internal wall adjacent to the entrance of the recess, the second protrusion comprising two adjacent second slopes; and a plurality of first conductive strips and a plurality of second conductive strips alternately formed on the base and covering one side of the top surface, two adjacent first slopes, and the first internal wall in that order; and a plurality of third conductive strips and a plurality of fourth conductive strips alternately formed on the base and covering the other side of the top surface, the two adjacent second slopes, and the second internal wall in that order.

17. The socket connecter of claim 16, wherein the plurality of first and second conductive strips and the plurality of third and fourth conductive strips are spaced by the recess.

18. The socket connecter of claim 16, further comprising a plurality of soldering pads connected to one end of each one of the plurality of first, second, third and fourth conductive strips on the top surface of the base distal from the recess, the plurality of soldering pads are arranged in a staggered fashion at opposite sides of the recess.

* * * * *